(12) United States Patent
Rhee et al.

(10) Patent No.: US 6,696,328 B2
(45) Date of Patent: Feb. 24, 2004

(54) CMOS GATE ELECTRODE USING SELECTIVE GROWTH AND A FABRICATION METHOD THEREOF

(75) Inventors: Hwa-sung Rhee, Seoul (KR); Geum-jong Bae, Suwon (KR); Sang-su Kim, Suwon (KR); Jung-il Lee, Gimcheon (KR); Young-ki Ha, Changwon (KR); Ki-chul Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/413,387

(22) Filed: Apr. 15, 2003

(65) Prior Publication Data

US 2003/0219938 A1 Nov. 27, 2003

(30) Foreign Application Priority Data

May 23, 2002 (KR) .......................... 2002-28703

(51) Int. Cl.[7] ...................... H01L 21/8238; H01L 29/76
(52) U.S. Cl. ...................... 438/199; 438/212; 438/216; 438/270; 438/299; 438/674; 438/933; 257/369; 257/377; 257/410; 257/412
(58) Field of Search .............................. 438/199, 212, 438/216, 229, 638, 269, 270, 275, 279, 672, 674, 933; 257/369, 377, 410, 411, 412, 413

(56) References Cited

U.S. PATENT DOCUMENTS

| | | | | |
|---|---|---|---|---|
| 5,998,807 A | | 12/1999 | Lustig et al. | 257/66 |
| 6,043,535 A | * | 3/2000 | Houston | 257/345 |
| 6,096,641 A | * | 8/2000 | Kunikiyo | 438/653 |
| 6,262,456 B1 | | 7/2001 | Yu et al. | 257/371 |
| 6,284,609 B1 | * | 9/2001 | Ang et al. | 438/299 |
| 6,406,962 B1 | * | 6/2002 | Agnello et al. | 438/270 |

OTHER PUBLICATIONS

Tsu–Jae King et al. A Polycrystalline–Si1–Xgex–Gate CMOS Technology, 1990, 253–256.

* cited by examiner

Primary Examiner—Kevin M. Picardat
(74) Attorney, Agent, or Firm—Lee & Sterba, P.C.

(57) ABSTRACT

A CMOS gate electrode formed using a selective growth method and a fabrication method thereof, wherein, in the CMOS gate electrode, a first gate pattern of polysilicon germanium (poly-SiGe) is formed on a PMOS region of a semiconductor substrate, and a second gate pattern of polysilicon is selectively grown from an underlying layer. Although the first gate pattern on the PMOS region is formed of poly-SiGe, the characteristics of the second gate pattern on the NMOS region do not deteriorate, thereby increasing the overall characteristics of a CMOS transistor.

38 Claims, 6 Drawing Sheets

CMOS GATE ELECTRODE USING SELECTIVE GROWTH AND A FABRICATION METHOD THEREOF

BACKGROUND OF THE INVENTION

1. Field of the Invention

The present invention relates to a semiconductor device and a fabrication method thereof. More particularly, the present invention relates to a gate pattern of a CMOS transistor that uses polysilicon germanium (poly-SiGe) as a gate electrode, and a fabrication method thereof.

2. Description of the Related Art

As semiconductor devices have been developed to be highly integrated, operate at high speed, and consume less power, scaling down of complementary metal oxide semiconductor (CMOS) transistors in semiconductor devices has been rapidly achieved. This scaling down, however, causes a short channel effect in the CMOS transistors. In order to suppress the short channel effect, a dual gate type CMOS transistor, in which a surface channel, symmetrical gate patterns, and a low-voltage threshold voltage Vth can be formed, is extensively used.

Conventionally, a dual gate type CMOS transistor is fabricated by depositing a polysilicon layer for a gate electrode on a semiconductor substrate, ion-implanting N-type impurities, such as phosphorous or arsenic, into an NMOS region and P-type impurities, such as boron, into a PMOS region.

However, the above conventional manufacturing method is disadvantageous in that it is difficult to precisely control the threshold voltage Vth of a gate pattern, and the characteristics of a PMOS element deteriorate because the thickness of a gate oxide layer is 50 Å or less, a poly gate depletion effect caused by penetration of a boron ion into a PMOS region appears, and the threshold voltage Vth is unstable.

To cope with the poly gate depletion effect, it has been suggested that a gate electrode be used with a polysilicon germanium layer instead of a polysilicon layer. Using the polysilicon germanium layer as the gate electrode makes it possible to use the conventional manufacturing method and suppresses the penetration of a boron ion into the PMOS region, thereby preventing an occurrence of the poly gate depletion effect. Further, an increase in the threshold voltage Vth due to a difference in work functions results in channel doping, thus improving current drivability due to an increase in carrier mobility.

The characteristics of a CMOS transistor that adopts a gate electrode of a polysilicon germanium layer, however, deteriorate in an NMOS region, unlike in the PMOS region. This is because polysilicon germanium has low solubility and a low deactivation rate with respect to phosphorous (P) or arsenic (Ar) as compared to polysilicon. For this reason, the thicker the density of germanium in the polysilicon germanium is, the more the poly gate depletion effect increases.

Therefore, if a polysilicon germanium layer is used as a gate electrode in the dual gate type CMOS transistor, the characteristics of the CMOS transistor are enhanced in the PMOS region but are reduced in the NMOS region, thereby preventing an improvement in the overall characteristics of the CMOS transistor.

In conclusion, a CMOS transistor having a gate electrode of a polysilicon germanium layer is conventionally fabricated by depositing a polysilicon germanium layer throughout PMOS and NMOS regions in a semiconductor substrate, and ion-implanting P-type and N-type impurities into the PMOS region and the NMOS region, respectively. Accordingly, in the resultant CMOS transistor, it is difficult to form a gate electrode of a different material, which is not P-type or N-type impurities, in the PMOS region and the NMOS region.

SUMMARY OF THE INVENTION

In an effort to solve the above problem, it is a first feature of an embodiment of the present invention to provide a method of manufacturing a CMOS gate electrode, in which polysilicon germanium is used as a material for a gate electrode in a PMOS region and polysilicon is used as a material for a gate electrode in an NMOS region, and also uses selective growth to prevent deterioration of overall CMOS transistor characteristics.

It is a second feature of an embodiment of the present invention to provide a CMOS gate electrode obtained using such a method.

To provide one aspect of the first feature of an embodiment of the present invention, there is provided a method of fabricating a CMOS gate electrode using a selective growth method, including (a) sequentially forming a gate oxide layer, a first polysilicon layer, and polysilicon germanium (poly-SiGe) layer on a semiconductor substrate in which an NMOS region and a PMOS region are defined by an isolation layer; (b) forming a hard mask layer on the PMOS region; (c) selectively removing the poly-SiGe layer from the NMOS region using the hard mask layer so as to expose the first polysilicon layer on the NMOS region; (d) selectively growing the exposed first polysilicon layer on the NMOS region so as to form a second polysilicon layer only on the NMOS region; (e) ion-implanting N-type impurities into the NMOS region, using the hard mask layer as an ion-implanting mask; (f) removing the hard mask layer; and (g) patterning the resultant structure to form first and second gate stacks on the PMOS region and the NMOS region, respectively.

Preferably, the isolation layer is a trench isolation layer, the first polysilicon layer is formed to a thickness in a range of about 50–500 Å, the poly-SiGe layer contains germanium in a concentration greater than about 20% and more preferably, in a concentration in a range of about 20–99%, and the first polysilicon layer and the poly-SiGe layer are formed in-situ in the same chamber.

Also preferably, the hard mask is a nitride layer, selectively removing the poly-SiGe layer is performed by wet etching, a mixture of $NH_4OH$, $H_2O$, and $H_2O_2$ is used as an etching solution during the wet etching, and selectively growing the second polysilicon layer is performed at a temperature in a range of about 500–850° C., using a gas containing silicon and an HCl gas.

Preferably, the method may further include after removing the hard mask layer, depositing a third polysilicon layer for forming a silicide layer on a top surface of the resultant structure. In addition, the method may further include forming gate spacers, which are preferably nitride layers, along sidewalls of the first and second gate stacks after forming the first and second gate stacks.

To provide another aspect of the first feature of an embodiment of the present invention, there is provided a method for manufacturing a CMOS gate electrode using a selective growth method, including (a) sequentially forming a gate oxide layer and a polysilicon germanium (poly-SiGe) layer on a semiconductor substrate in which an NMOS region and a PMOS region are defined by an isolation layer; (b) forming a hard mask layer on the PMOS region; (c) selectively etching a portion of the poly-SiGe layer from the NMOS region using the hard mask layer; (d) selectively growing the poly-SiGe layer that remains on the NMOS region to form a first polysilicon layer; (e) ion-implanting N-type impurities into only the NMOS region using the hard mask layer as an ion-implanting mask; (f) removing the hard mask layer; and (g) patterning the resultant structure to form a first gate stack on the PMOS region and the second gate stack on the NMOS region.

Preferably, the poly-SiGe layer contains germanium in a concentration greater than about 20% and more preferable, in a range of about 20–99%, and when selectively etching a portion of the poly-SiGe layer on the NMOS region, the poly-SiGe layer, which remains on the NMOS region, is etched to have a thickness in a range of about 50–500 Å.

Preferably, the method may further include depositing a second polysilicon layer on a top surface of the resultant structure after removing the hard mask layer, and forming gate spacers, which are preferably nitride layers, along sidewalls of the first and second gate stacks after patterning the resultant structure.

To provide one aspect of the second feature of an embodiment of the present invention, there is provided a CMOS gate electrode fabricated by a selective growth method, including a semiconductor substrate in which a PMOS region and an NMOS region are defined by an isolation layer; a first gate stack formed on the PMOS region, the first gate stack including a gate oxide layer, a first gate electrode formed by depositing on the gate oxide layer polysilicon which is transformed into poly-SiGe due to diffusion of a second gate electrode formed of poly-SiGe that is deposited on the first gate electrode; and a second gate stack formed on the NMOS region, the second gate stack including a gate oxide layer, a first gate electrode formed of polysilicon, and a second gate electrode that is formed by selectively growing the first gate electrode on the first gate electrode.

Preferably, the first and second gate stacks may further include a third polysilicon layer for forming a silicide layer on the second electrode. In addition, a gate spacer may be formed along sidewalls of each of the first and second gate stacks.

To provide another aspect of the second feature of an embodiment of the present invention, there is provided a CMOS gate electrode fabricated by a selective growth method, including a semiconductor substrate in which a PMOS region and an NMOS region are defined by an isolation layer; a first gate stack formed on the PMOS region, the first gate stack including a gate oxide layer, and a first gate electrode formed by depositing on the gate oxide layer poly-SiGe; and a second gate stack formed on the NMOS region, the second gate stack including a gate oxide layer, a first gate electrode that is formed by depositing on the gate oxide layer poly-SiGe which changes into a polysilicon layer due to a diffusion process, and a second gate electrode formed by growing the first gate stack and formed of polysilicon.

Preferably, the first gate stack further includes a second polysilicon layer for forming a suicide layer on the first gate electrode, and the first gate stack further includes gate spacers formed along the sidewalls of the gate oxide layer, the first gate electrode, and the second polysilicon layer. In addition, a gate spacer may be formed along sidewalls of each of the first and second gate stacks.

According to the present invention, polysilicon germanium is used as a material for a gate electrode in a PMOS region of a CMOS transistor and polysilicon is used as a material for a gate electrode in an NMOS region of the CMOS transistor. Accordingly, even while using process steps from a conventional method of manufacturing a CMOS transistor, it is possible to prevent deterioration of the CMOS transistor in the NMOS region and reduce poly gate depletion effect thus obtaining excellent PMOS characteristics, thereby improving the characteristics of the overall CMOS transistor.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF THE INVENTION

Figure 1:
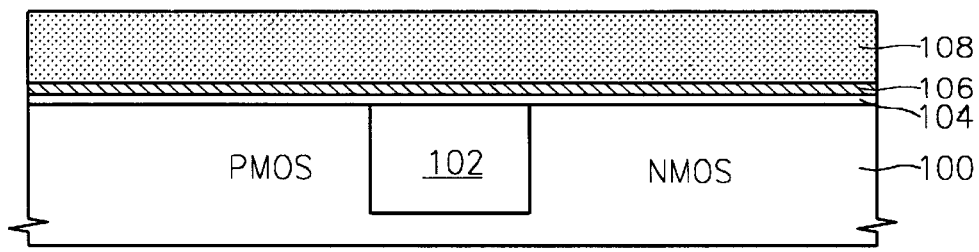
FIGS. 1 through 7 illustrate cross-sectional views of stages in the manufacture of a CMOS transistor for explaining a CMOS gate electrode obtained using a selective growth method and a manufacturing method thereof, according to a preferred embodiment of the present invention.

Korean Patent Application No. 02-28703, filed May 23, 2002, and entitled: "CMOS Gate Electrode Using Selective Growth and Fabrication Method Thereof," is incorporated herein in its entirety.

The present invention now will be described more fully with reference to the accompanying drawings, in which preferred embodiments of the invention are shown. This invention may, however, be embodied in many different forms and should not be construed as being limited to the embodiments set forth here. Rather, these embodiments are provided so that this disclosure will be thorough and complete, and will fully convey the concept of the invention to those skilled in the art. In the drawings, the thickness of layers and regions may be exaggerated for clarity. It will also be understood that when a layer is referred to as being "on" another layer or a substrate, it may be directly on the other layer or the substrate, or intervening layers may also be present. Like reference numerals in different drawings refer to like elements throughout.

More specifically, in this disclosure, an etching process is broadly described and thus it must not be understood as being limited to a wet etching process. For example, in a first embodiment of the present invention, a polysilicon germanium layer is wet-etched but alternatively, it may be dry-etched. In addition, a cobalt silicide ($CoSi_x$) on an uppermost portion of a gate pattern may be replaced with silicide of a different type.

First Embodiment

FIGS. 1 through 7 illustrate cross-sectional views of stages in the manufacture of a CMOS transistor for explaining a CMOS gate electrode obtained using a selective growth method and a manufacturing method thereof, according to a preferred embodiment of the present invention.

Referring to FIG. 1, ion-implantation is performed on a semiconductor substrate 100 to form N-type and P-type wells thereon, and then, a portion of the semiconductor substrate 100 is etched to form an isolation layer, preferably a trench isolation layer, 102. In the semiconductor substrate 100, a PMOS region and an NMOS region are defined by the isolation region 102. Next, a gate oxide layer 104 is formed on the semiconductor substrate 100 to cover the trench isolation layer 102. Thereafter, a first polysilicon layer 106 for a first gate electrode is formed to a thickness of about 500 Å or less on the gate oxide layer 104. For example, the first polysilicon layer may be formed to a thickness in a range of about 50–500 Å. Then, a polysilicon germanium (poly-SiGe) layer 108 for a second gate electrode is formed on the first polysilicon layer 106.

It is preferable that the poly-SiGe layer 108 contains germanium in a concentration of 20% or greater. More preferably, the concentration of germanium is in a range of about 20–99%. In addition, the first polysilicon layer 106 and the poly-SiGe layer 108 may be formed in-situ in the same chemical vapor deposition (CVD) equipment chamber.

The first polysilicon layer 106 is deposited at a temperature in a range of about 550–650° C., using $SiH_4$ gas or $Si_2H_5$ gas. The poly-SiGe layer 108 is deposited at a temperature in a range of about 450–600° C., using $SiH_4$ gas or $GeH_4$ gas. Preferably, the first polysilicon layer 106 and the poly-SiGe layer 108 together, which constitute the gate electrode, are formed to a combined thickness of about 1000 Å or greater during a subsequent process in which a gate pattern is completed.

Figure 2:
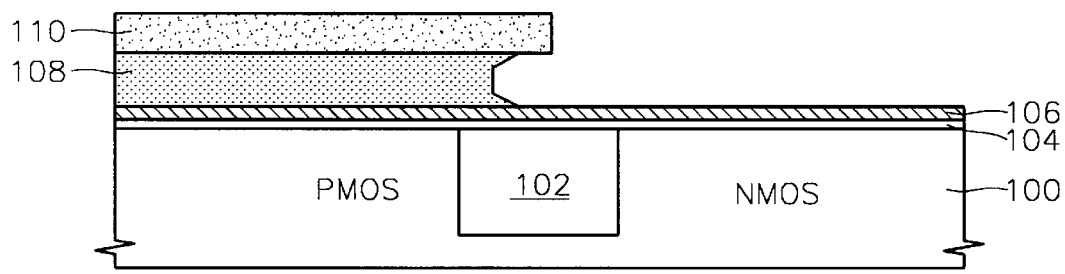
Figure 8:
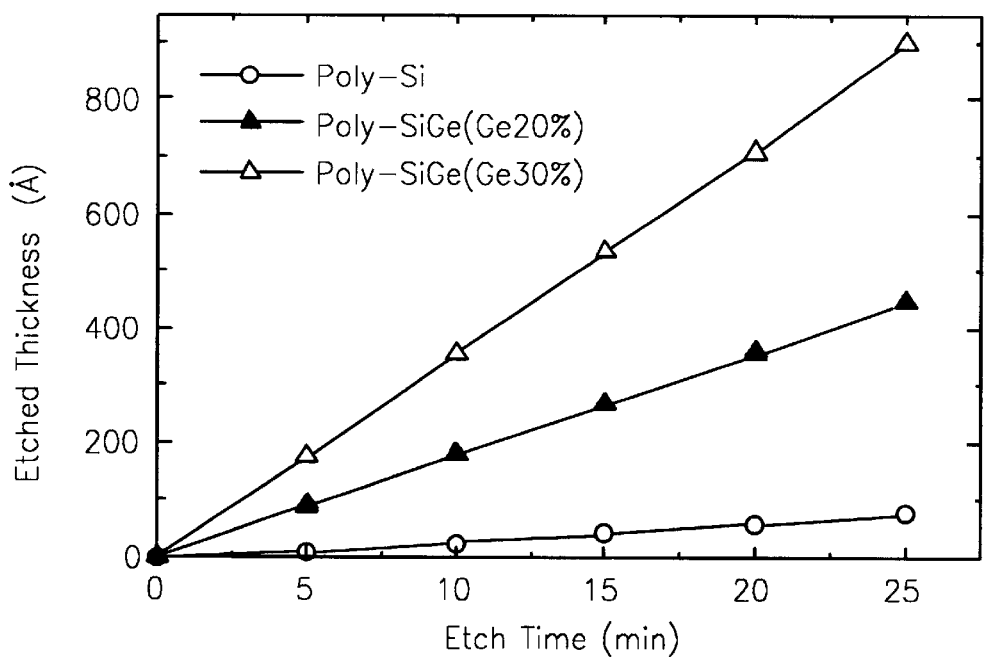
FIG. 8 is a graph illustrating a method of selectively etching a polysilicon germanium layer shown in FIG. 2.

Referring to FIGS. 2 and 8, a hard mark layer 110, such as a nitride layer, is deposited on the poly-SiGe layer 108. Next, an etch mask is formed on the hard mask layer 110, using a photoresist pattern and the hard mask layer 110 is removed from the NMOS region. Thereafter, the poly-SiGe layer 108 is selectively etched using the hard mask layer 110, which remains only on the PMOS region, to expose the first polysilicon layer 106. The selective etching of the poly-SiGe layer 108 may be performed using a dry etching or a wet etching.

FIG. 8 is a graph illustrating etching rates when a polysilicon layer (-○-), a poly-SiGe layer (-▲-) that contains germanium in a concentration of 20%, and a poly-SiGe layer (-▲-) that contains germanium in a concentration of 30% are etched at a temperature in a range of about 45–70° C., using a mixture of $NH_4OH$, $H_2O$, and $H_2O_2$ gas as a wet-etching solution. In the graph, the x-axis represents etching time in minutes and the y-axis represents the etched thickness of these layers (Å). From the graph, it may be seen that the 30% concentration poly-SiGe layer (-Δ-) has a higher etching rate than the 20% concentration poly-SiGe layer (-▲-). Thus, the higher the concentration of germanium in a poly-SiGe layer, the higher the etching rate of the poly-SiGe layer. Therefore, using a difference in the etching rates of poly-SiGe layers having different germanium concentrations, only the poly-SiGe layer 108 may be selectively etched from the first polysilicon layer 106 in the NMOS region of FIG. 2.

Referring back to FIG. 3, a second polysilicon layer 112 is grown on the exposed first polysilicon layer 106 in the NMOS region, using a selective growth method. The growth of the second polysilicon layer 112 is carried out at a temperature in a range of about 500–850° C., using gas containing silicon, such as $SiH2Cl_2$, $SiH_4$, $Si_2H_6$, and $SiCl_4$, and HCl gas. As a result, the second polysilicon layer 112 is formed on the first polysilicon layer 106 in the NMOS region but it is not formed in the PMOS region, the top of which is covered by the hard mask layer 110 formed of a nitride layer and the bottom of which is covered by the gate oxide layer 104.

Thereafter, N-type impurities, such as phosphorous (P) or arsenic (Ar), are ion-implanted into the NMOS region, using the hard mask layer 110 as an ion-implanting mask. According to the present invention, the hard mask layer 110, which was used during the etching process, may be reused during the ion-implanting process in the NMOS region so as to suppress the occurrence of the poly gate depletion effect. Therefore, an additional process of forming an ion-implanting mask is not required.

Figure 4:
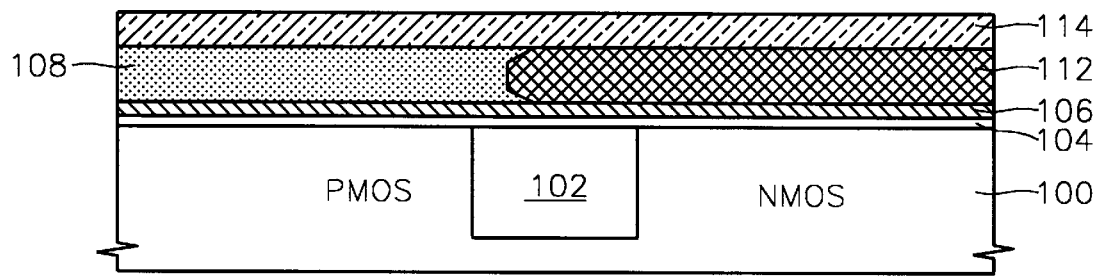

Referring to FIG. 4, the implanted N-type impurities are thermally treated to activate the N-type impurities, and then, the hard mask layer 110 is removed. If required, a third polysilicon layer 114 may be formed on the entire exposed resultant structure in order to cover the polysilicon SiGe layer 108 and the second polysilicon layer 112. The third polysilicon layer 114 makes it possible to form a cobalt silicide ($CoSi_x$) layer (not shown) on the polysilicon SiGe layer 108 and the second polysilicon layer 112 so as to reduce contagious resistance or surface resistance thereon. In general, a $CoSi_x$ layer is not typically formed on a poly-SiGe layer, and the resistivity of the poly-SiGe layer is higher than that of a polysilicon layer even though the $CoSi_x$ layer may be formed on the poly-SiGe layer. Accordingly, it is preferable that the uppermost layer of the gate pattern is formed with a polysilicon layer. In addition, the third polysilicon layer 114 is preferably formed to a thickness of about 1000 Å.

Figure 5:
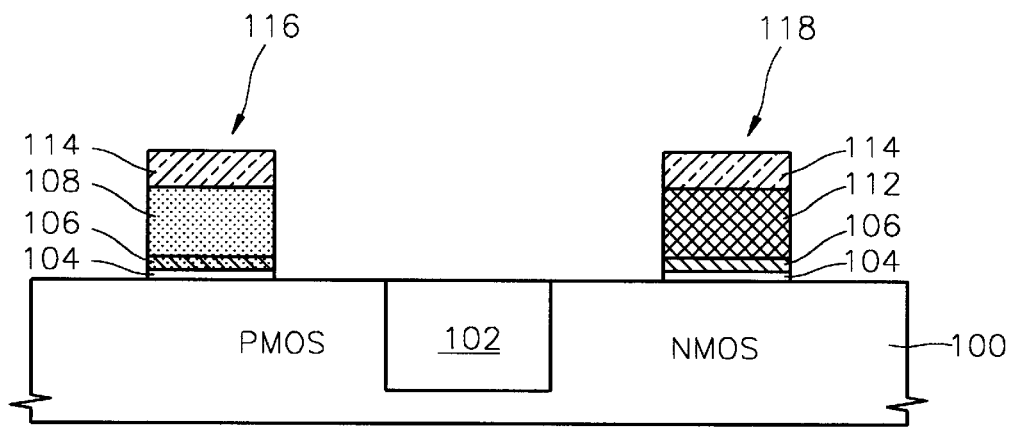

Referring to FIG. 5, the resultant structure having the third polysilicon layer 114 is patterned to form first and second gate stacks 116 and 118 in the PMOS region and the NMOS region, respectively.

The first gate stack 116 includes the gate oxide layer 104, the polysilicon layer 106, the poly-SiGe layer 108, and the third polysilicon layer 114. Here, the polysilicon layer 106 in the PMOS region becomes a poly-SiGe layer gate by high-temperature processes, such as a reoxidation process and an activation annealing process, performed during a subsequent process of forming a gate pattern 124, as will be shown in connection with FIGS. 6 and 7. In other words, the thickness of the first polysilicon layer 106 is thinner than that of the poly-SiGe layer 108. During a high-temperature thermal process, germanium in a concentration of 20–99% contained in the poly-SiGe layer 108 is diffused into the first polysilicon layer 106, which is present below the poly-SiGe layer 108. As a result of this diffusion, the first polysilicon layer 106 changes into a layer having characteristics similar to the poly-SiGe layer 108.

The second gate stack 118 includes the gate oxide layer 104, the first polysilicon layer 106, the second polysilicon layer 112, which is selectively grown, and the third polysilicon layer 114.

Figure 3:
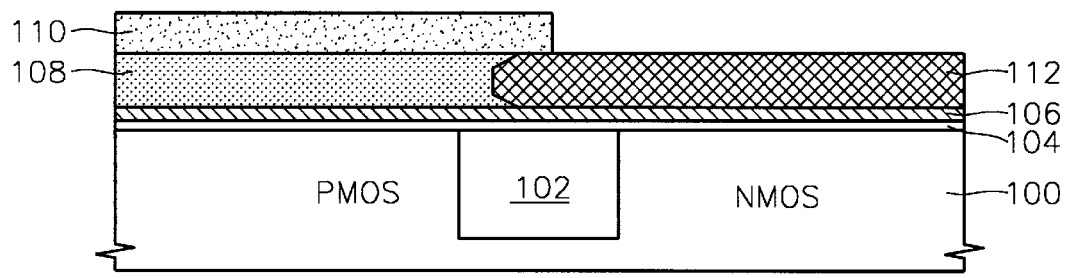
Figure 6:
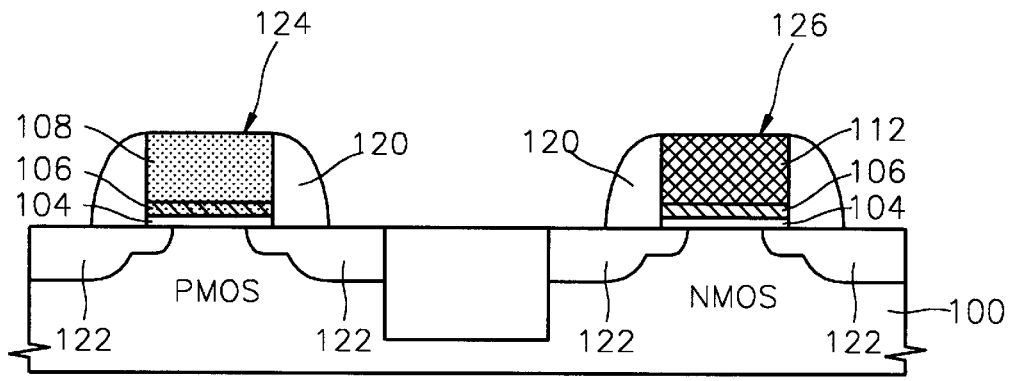

Referring to FIG. 6, the resultant structure of FIG. 3, i.e., after the removal of the hard mask layer 110, and on which the third polysilicon layer 114 is not formed, is patterned to form gate stacks. Next, an ion-implanting process is performed to form source/drain regions 122. Thereafter, gate spacers 120 of nitride layers are formed along the sidewalls of the gate stacks.

As a result, a first gate pattern 124, which includes the gate oxide layer 104, the first polysilicon layer 106, which almost changes into a poly-SiGe layer, the poly-SiGe layer 108, and the gate spacers 120, is formed in the PMOS region. In addition, a second gate pattern 126, which includes the gate oxide layer 104, the first polysilicon layer 106, the second polysilicon layer 112, which was selectively grown, and the gate spacers 120, is formed on the NMOS region.

Figure 7:
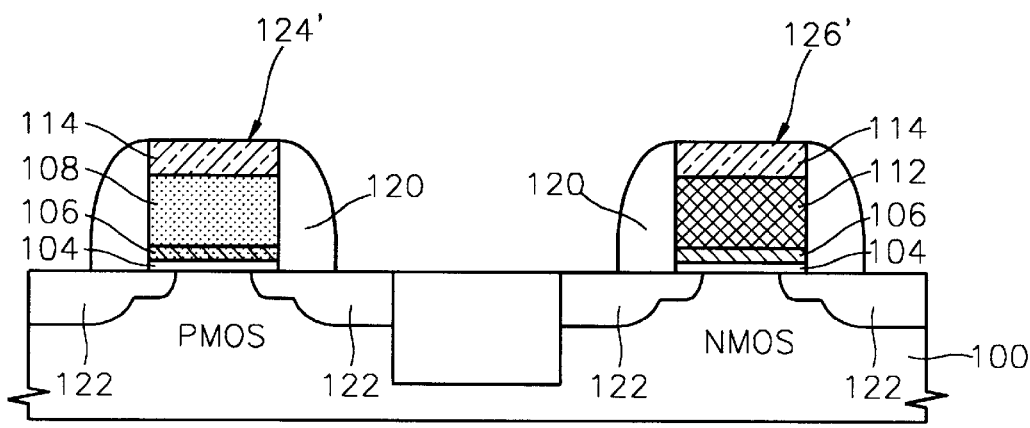

Referring to FIGS. 5 and 7, in a case where the resultant structure shown in FIG. 5, i.e., the structure including the third polysilicon layer 114, is patterned, an ion-implanting process is performed on the patterned structure to form source/drain regions 122, and then, gate spacers 120 are formed along the sidewalls of the gate stacks 116 and 118.

As a result, a first gate pattern 124', which includes the gate oxide layer 104, the first polysilicon layer 106, which almost becomes a poly-SiGe layer, the poly-SiGe layer 108, the third polysilicon layer 114, and the gate spacers 120, is formed in the PMOS region. In addition, a second gate pattern 126', which includes the gate oxide layer 104, the first polysilicon layer 106, the second polysilicon layer 112, which was selectively grown, the third polysilicon layer 114, and the gate spacers 120, is formed on the NMOS region.

Second Embodiment

FIGS. 9 through 15 illustrate cross-sectional views of stages in the manufacture of a CMOS transistor for explaining a CMOS gate electrode obtained using a selective growth method and a manufacturing method thereof, according to a second embodiment of the present invention. To facilitate explanation of this second embodiment, explanations of elements having the same function and structure as in the first embodiment will be omitted here.

Figure 9:
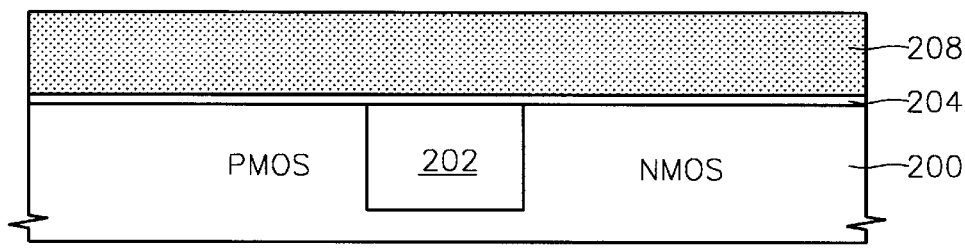
FIGS. 9 through 15 illustrate cross-sectional views of stages in the manufacture of a CMOS transistor for explaining a CMOS gate electrode obtained using a selective growth method and a manufacturing method thereof, according to a second embodiment of the present invention.

Referring to FIG. 9, an isolation layer, preferably a trench isolation layer 202, is formed in a semiconductor substrate 200 to define a PMOS region and an NMOS regions therein. Next, a gate oxide layer 204 and a poly-SiGe layer 208 having a concentration of germanium in a range of about 20–99% are sequentially formed on the semiconductor substrate 200.

Figure 10:
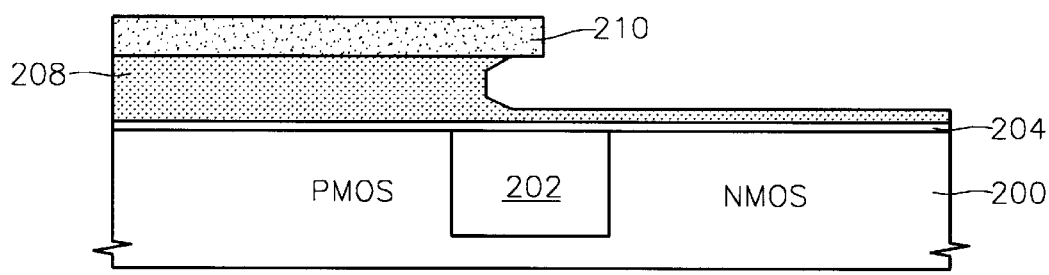

Referring to FIG. 10, a hard mask layer 210 of a nitride layer is formed only on the PMOS region, and the poly-SiGe layer 208 in the NMOS region is etched to a thickness in a range of about 50–500 Å. At this time, a portion of the poly-SiGe layer 208 may be removed by adjusting an etching time of a wet etching or a dry etching.

Figure 11:
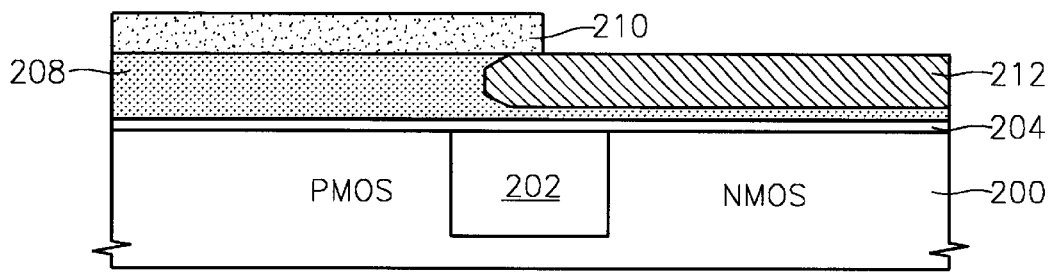

49 Referring to FIG. 11, the exposed poly-SiGe layer 208 is selectively grown in the NMOS region to form a first polysilicon layer 212 on the poly-SiGe layer 208 in the NMOS region. As in the first embodiment, the first polysilicon layer 212 may also be deposited at a temperature in a range of about 500–850° C., using a gas containing silicon and HCl gas.

Figure 12:
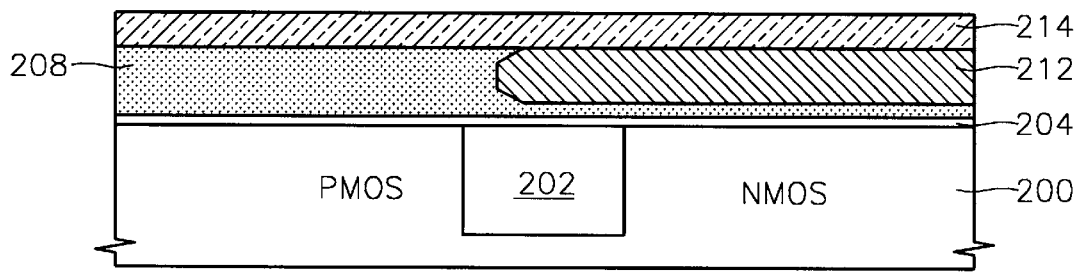

Referring to FIG. 12, the hard mask layer 210 is removed, and then, if desirable, a second polysilicon layer 214 may be formed on the entire resultant structure.

Figure 13:
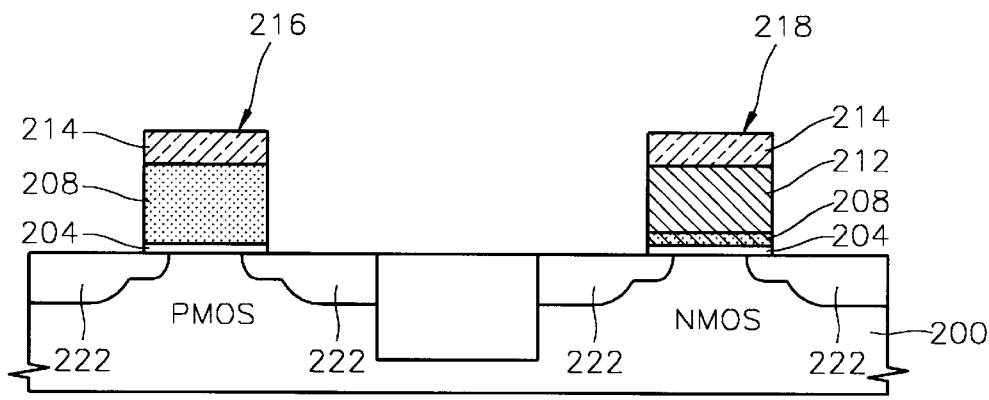

Referring to FIG. 13, the resultant structure having the second polysilicon layer 214 is patterned to form first and second gate stacks 216 and 218. As a result, the first gate stack 216, which includes the gate oxide layer 204, the poly-SiGe layer 208, and the second polysilicon layer 214, is formed in the PMOS region. In addition, the second gate stack 218, which includes the gate oxide layer 204, the poly-SiGe layer 208, which becomes a polysilicon layer during a high-temperature thermal process, the first polysilicon layer 212, which is selectively grown, and the second polysilicon layer 214. Next, an ion-implanting process is performed to form source/drain regions 222.

The poly-SiGe layer 208 of the second gate stack 218 becomes a polysilicon layer when germanium contained in the poly-SiGe layer 208 is diffused into the first polysilicon layer 212, which is present on the poly-SiGe layer 208, during a high-temperature thermal process, such as a gate reoxidation process and an activation annealing process. As a result, when a gate pattern 226 as shown in FIG. 15 has been completed, the poly-SiGe layer 208 has changed into a layer having similar characteristics to a polysilicon layer having a concentration of germanium.

Figure 14:
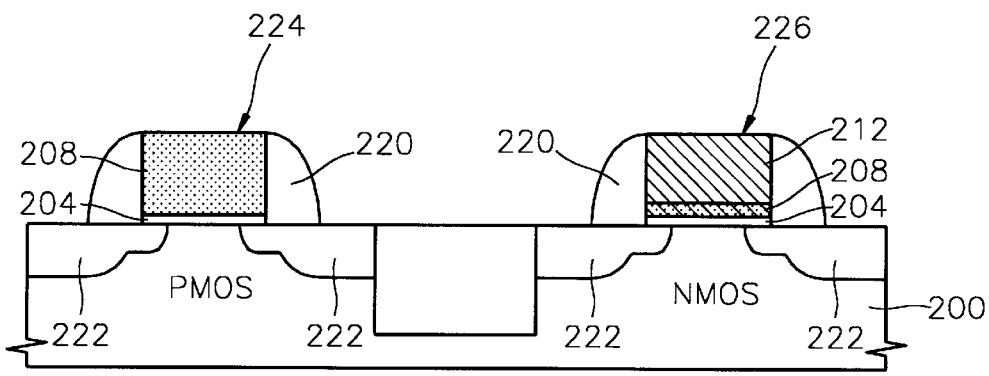

53 Referring to FIG. 14, gate spacers 220 are formed along the sidewalls of gate stacks of the resultant structure shown in FIG. 11, i.e., after the removal of the hard mask layer 210, on which the second polysilicon layer 214 is not formed. Thus, a first gate pattern 224, which includes the gate oxide layer 204, the poly-SiGe layer 208, and the gate spacers 220, is formed in the PMOS region. In addition, a second gate pattern 226, which includes the gate oxide layer 204, the poly-SiGe layer 208, which changes into a polysilicon layer, the first polysilicon layer 212, which is selectively grown, and the gate spacers 220, is formed on the NMOS region.

Figure 15:
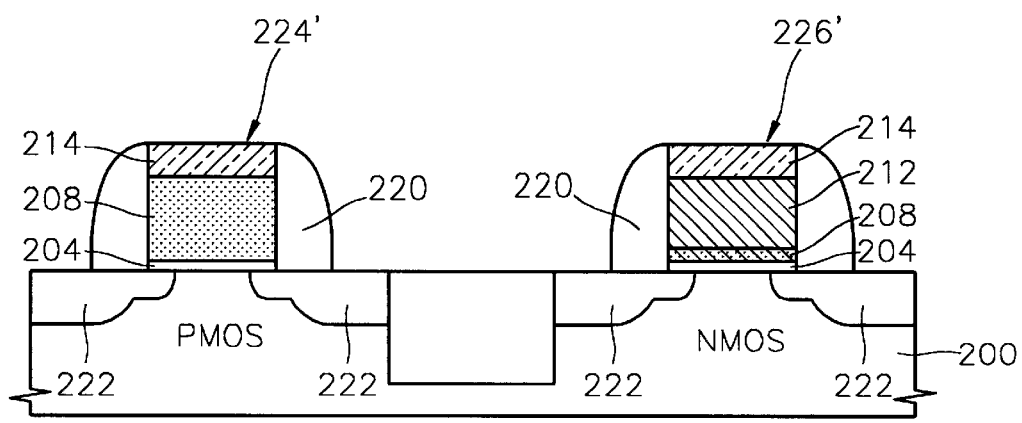

54 Referring to FIG. 15, the gate spacers 220 are formed along the sidewalls of the gate stacks 216 and 218 of the resultant structure of FIG. 13, which includes the second polysilicon layer 214. Thus, a first gate pattern 224', which includes the gate oxide layer 204, the poly-SiGe layer 208, the second polysilicon layer 214, and the gate spacers 220, is formed on the PMOS region. In addition, a second gate pattern 226', which includes the gate oxide layer 204, the poly-SiGe layer 208, which becomes a polysilicon layer, the first polysilicon layer 212, which is selectively grown, the second polysilicon layer 214, and the gate spacers 220, is formed on the NMOS region.

The present invention possesses several advantageous over the conventional art. First, poly-SiGe may be used as a material for a gate electrode in a PMOS region of a CMOS transistor while polysilicon may be used as a material for a gate electrode in an NMOS region of the CMOS transistor, even though a conventional method of manufacturing a CMOS transistor is may be used. Second, it is possible to prevent deterioration of the characteristics of the CMOS transistor in the NMOS region, because polysilicon is used as a material for a gate electrode in the NMOS region. Third, even though the concentration of germanium contained in a poly-SiGe layer is increased, the concentration of germanium is increased only in the PMOS region, because the gate electrode in the NMOS region is formed of polysilicon, thereby suppressing a poly gate depletion effect. Fourth, it is possible to make a gate pattern in which the characteristics of the CMOS transistor in the PMOS region may be enhanced but deterioration of the characteristics of the CMOS transistor may be prevented, thereby increasing the overall CMOS transistor characteristics.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a CMOS gate electrode using a selective growth method, comprising:
(a) sequentially forming a gate oxide layer, a first polysilicon layer, and a polysilicon germanium (poly-SiGe) layer on a semiconductor substrate in which an NMOS region and a PMOS region are defined by an isolation layer;

(b) forming a hard mask layer on the PMOS region;

(c) selectively removing the poly-SiGe layer from the NMOS region using the hard mask layer so as to expose the first polysilicon layer on the NMOS region;

(d) selectively growing the exposed first polysilicon layer on the NMOS region so as to form a second polysilicon layer only on the NMOS region;

(e) ion-implanting N-type impurities into the NMOS region, using the hard mask layer as an ion-implanting mask;

(f) removing the hard mask layer; and (g) patterning the resultant structure to form first and second gate stacks on the PMOS region and the NMOS region, respectively.

2. The method as claimed in claim 1, wherein the isolation layer is trench isolation layer.

3. The method as claimed in claim 1, wherein the first polysilicon layer is formed to a thickness in a range of about 50–500 Å.

4. The method as claimed in claim 1, wherein the poly-SiGe layer contains germanium in a concentration of about 20% or greater.

5. The method as claimed in claim 4, wherein the poly-SiGe layer contains germanium in a concentration in a range of about 20–99%.

6. The method as claimed in claim 1, wherein the first polysilicon layer and the poly-SiGe layer are formed in-situ in the same chamber.

7. The method as claimed in claim 1, wherein the hard mask is a nitride layer.

8. The method as claimed in claim 1, wherein selectively removing the poly-SiGe layer is performed by a wet etching.

9. The method as claimed in claim 8, wherein during the wet etching, a mixture of $NH_4OH$, $H_2O$, and $H_2O_2$ is used as an etching solution.

10. The method as claimed in claim 1, wherein selectively growing the second polysilicon layer is performed at a temperature in a range of about 500–850° C., using a gas containing silicon and an HCl gas.

11. The method as claimed in claim 1, wherein the first polysilicon layer is deposited at a temperature in a range of about 550–650° C., using $SiH_4$ gas or $Si_2H_5$ gas.

12. The method as claimed in claim 1, wherein the poly-SiGe layer is deposited at a temperature in a range of about 450–600° C., using $SiH_4$ gas or $GeH_4$ gas.

13. The method as claimed in claim 1, wherein the first polysilicon layer and the poly-SiGe layer have a combined thickness of about 1000 Å or greater.

14. The method as claimed in claim 1, further comprising after removing the hard mask layer, depositing a third polysilicon layer for forming a silicide layer on a top surface of the resultant structure.

15. The method as claimed in claim 1, further comprising after forming the first and second gate stacks, forming gate spacers along sidewalls of the first and second gate stacks.

16. The method as claimed in claim 15, wherein the gate spacers are nitride layers.

17. A CMOS gate electrode fabricated by a selective growth method, comprising:

a semiconductor substrate in which a PMOS region and an NMOS region are defined by an isolation layer;

a first gate stack formed on the PMOS region, the first gate stack including a gate oxide layer, a first gate electrode formed by depositing on the gate oxide layer polysilicon which is transformed into polysilicon germanium (poly-SiGe) due to diffusion of a second gate electrode formed of poly-SiGe that is deposited on the first gate electrode; and a second gate stack formed on the NMOS region, the second gate stack including a gate oxide layer, a first gate electrode formed of polysilicon, and a second gate electrode that is formed by selectively growing the first gate electrode on the first gate electrode.

18. The CMOS gate electrode as claimed in claim 17, wherein the first gate stack further comprises a third polysilicon layer for forming a silicide layer on the second gate electrode.

19. The CMOS gate electrode as claimed in claim 18, wherein the first gate stack further comprises gate spacers formed along sidewalls of the gate oxide layer, the first gate electrode, the second gate electrode, and the third polysilicon layer.

20. The CMOS gate electrode as claimed in claim 17, wherein the first gate stack further comprises gate spacers formed along sidewalls of the gate oxide layer, the first gate electrode, and the second gate electrode.

21. The CMOS gate electrode as claimed in claim 17, wherein the second gate stack further comprises a third polysilicon layer for forming a silicide layer on the second gate electrode.

22. The CMOS gate electrode as claimed in claim 21, wherein the second gate stack further comprises gate spacers formed along sidewalls of the gate oxide layer, the first gate electrode, the second gate electrode, and the third polysilicon layer.

23. The CMOS gate electrode as claimed in claim 17, wherein the second gate stack further comprises gate spacers formed along sidewalls of the gate oxide layer, the first gate electrode, and the second gate electrode.

24. A method for manufacturing a CMOS gate electrode using a selective growth method, comprising:

(a) sequentially forming a gate oxide layer and a polysilicon germanium (poly-SiGe) layer on a semiconductor substrate in which an NMOS region and a PMOS region are defined by an isolation layer;

(b) forming a hard mask layer on the PMOS region;

(c) selectively etching a portion of the poly-SiGe layer from the NMOS region using the hard mask layer;

(d) selectively growing the poly-SiGe layer that remains on the NMOS region to form a first polysilicon layer;

(e) ion-implanting N-type impurities into only the NMOS region using the hard mask layer as an ion-implanting mask;

(f) removing the hard mask layer; and (g) patterning the resultant structure to form a first gate stack on the PMOS region and a second gate stack on the NMOS region.

25. The method as claimed in claim 24, wherein the isolation layer is a trench isolation layer.

26. The method as claimed in claim 24, wherein the poly-SiGe layer contains germanium in a concentration of about 20% or greater.

27. The method as claimed in claim 26, wherein the poly-SiGe layer contains germanium in a concentration in a range of about 20–99%.

28. The method as claimed in claim 24, wherein when selectively etching a portion of the poly-SiGe layer on the NMOS region, the poly-SiGe layer, which remains on the NMOS region, is etched to have a thickness in a range of about 50–500 Å.

29. The method as claimed in claim 24, further comprising after removing the hard mask layer, depositing a second polysilicon layer on a top surface of the resultant structure.

30. The method as claimed in claim 24, further comprising after patterning the resultant structure, forming gate spacers along sidewalls of the first and second gate stacks.

31. The method as claimed in claim 30, wherein the gate spacers are nitride layers.

32. A CMOS gate electrode fabricated by a selective growth method, comprising:
- a semiconductor substrate in which a PMOS region and an NMOS region are defined by an isolation layer;
- a first gate stack formed on the PMOS region, the first gate stack including a gate oxide layer, and a first gate electrode formed by depositing on the gate oxide layer polysilicon germanium (poly-SiGe); and
- a second gate stack formed on the NMOS region, the second gate stack including a gate oxide layer, a first gate electrode that is formed by depositing on the gate oxide layer poly-SiGe which changes into a polysilicon layer due to a diffusion process, and a second gate electrode formed by growing the first gate stack and formed of polysilicon.

33. The CMOS gate electrode as claimed in claim 32, wherein the first gate stack further comprises a second polysilicon layer for forming a silicide layer on the first gate electrode.

34. The CMOS gate electrode as claimed in claim 33, wherein the first gate stack further comprises gate spacers formed along sidewalls of the gate oxide layer, the first gate electrode, and the second polysilicon layer.

35. The CMOS gate electrode as claimed in claim 32, wherein the first gate stack further comprises gate spacers formed along sidewalls of the gate oxide layer and the first gate electrode.

36. The CMOS gate electrode as claimed in claim 32, wherein the second gate stack further comprises a second polysilicon layer on the second gate electrode.

37. The CMOS gate electrode as claimed in claim 36, wherein the second gate stack further comprises gate spacers formed along sidewalls of the gate oxide layer, the first gate electrode, the second gate electrode, and the second polysilicon layer.

38. The CMOS gate electrode as claimed in claim 32, wherein the second gate stack further comprises gate spacers formed along sidewalls of the gate oxide layer, the first gate electrode, and the second gate electrode.

* * * * *